US012776618B2

(12) United States Patent
Kuo et al.

(10) Patent No.: US 12,776,618 B2
(45) Date of Patent: Oct. 27, 2026

(54) PACKAGE STRUCTURE

(71) Applicant: ENNOSTAR CORPORATION, Hsinchu City (TW)

(72) Inventors: Meng Hsin Kuo, Hsinchu (TW); Ming-Jing Lee, Hsinchu (TW); Yi-Min Chen, Hsinchu (TW)

(73) Assignee: ENNOSTAR CORPORATION, Hsinchu City (TW)

( * ) Notice: Subject to any disclaimer, the term of this patent is extended or adjusted under 35 U.S.C. 154(b) by 559 days.

(21) Appl. No.: 18/344,715

(22) Filed: Jun. 29, 2023

(65) Prior Publication Data

US 2024/0006842 A1 Jan. 4, 2024

(30) Foreign Application Priority Data

Jun. 30, 2022 (CN) ......................... 202210770656.6

(51) Int. Cl.

| | |
|---|---|
| ***H01S 5/0232*** | (2021.01) |
| ***H01S 5/02253*** | (2021.01) |
| ***H01S 5/024*** | (2006.01) |
| ***H01S 5/028*** | (2006.01) |
| *H01S 5/183* | (2006.01) |

(52) U.S. Cl.

CPC ........ *H01S 5/0232* (2021.01); *H01S 5/02253* (2021.01); *H01S 5/02469* (2013.01); *H01S 5/0283* (2013.01); *H01S 5/183* (2013.01)

(58) Field of Classification Search

CPC ............... H01S 5/0232; H01S 5/02253; H01S 5/02469; H01S 5/0283; H01S 5/183; H01S 5/02208; H01S 5/02218; H01S 5/02315; H01S 5/02438; H10H 20/8506; H10H 20/036

See application file for complete search history.

(56) References Cited

U.S. PATENT DOCUMENTS

| | | | | |
|---|---|---|---|---|
| 6,027,630 | A | 2/2000 | Cohen | |
| 6,059,188 | A * | 5/2000 | diFazio | G06K 7/10742 235/462.36 |
| 2012/0307481 | A1* | 12/2012 | Joo | H10H 20/856 362/241 |
| 2013/0322068 | A1* | 12/2013 | Clark | H10H 20/855 362/249.02 |
| 2019/0326490 | A1 | 10/2019 | Haiberger et al. | |
| 2019/0393586 | A1* | 12/2019 | Ayala Vazquez | H01Q 5/328 |
| 2021/0083451 | A1* | 3/2021 | Hashimoto | H10H 20/8506 |

FOREIGN PATENT DOCUMENTS

| | | | | |
|---|---|---|---|---|
| CN | 102956764 | A | 3/2013 | |
| CN | 111106222 | A * | 5/2020 | H10H 20/857 |

OTHER PUBLICATIONS

Translation of CN-111106222.*

China Patent Office, Office Action, Patent Application No. 202210770656.6, Mar. 27, 2026, 15 pages, China.

* cited by examiner

*Primary Examiner* — Xinning (Tom) Niu

(57) ABSTRACT

A package structure is provided. The package structure includes a substrate, a frame structure, and a lens portion. The frame structure is disposed on the substrate. A sidewall of the frame structure has multiple lamination traces thereon. The lens portion covers the substrate. The frame structure has a through hole passing through the sidewall, and the through hole includes an edge, and a portion of the lamination traces overlaps the edge of the through hole.

10 Claims, 7 Drawing Sheets

PACKAGE STRUCTURE

CROSS REFERENCE TO RELATED APPLICATIONS

This application claims priority of China Patent Application No. 202210770656.6 filed on Jun. 30, 2022, the entirety of which is incorporated by reference herein.

BACKGROUND

Technical Field

The present disclosure relates to package structure, and it relates to a package structure with a through hole in particular.

Description of the Related Art

With the increasing demand of market for laser TOF (Time of Flight) modules, how to improve the reliability of vertical cavity surface emitting laser (VCSEL) packaging has gradually become an important issue. The packages of VCSELs contain microstructures on chips or lenses, such as light extraction holes on the chips or microlens arrays on the lenses. A poor packaging may contaminate the microstructures and cause the failure of the chips or lenses, and the shape of the laser light presented may also be abnormal.

Since the internal medium of the vertical cavity surface emitting laser packages is air, considering the thermal expansion of the gas, such packages are usually designed with air escape holes to avoid structural damage caused by gas expansion, and the position of the air escape hole is greatly associated with the reliability of the product. When the air escape hole is at the bottom, impurities like flux may enter the package structure easily through the air escape hole to contaminate the microstructure during product bonding. When the air escape hole is at the top, the edge of the lens used for packaging is not able to be glued by the adhesive so the microstructures is exposed to air. When exposed to moisture for a long time, the microstructures are prone to peeling at the edge of the lens, resulting in reliability failure. Therefore, the best position for setting the air escape hole is the middle of the sidewalls of the package structure.

Plastic materials are used for conventional package structures, and holes are formed on the sidewalls. Such a design can set the air escape hole in the middle of the sidewalls, but the manufacturing process is complicated. There are more and more designs with metal sidewalls. The advantages are that the process is simple, the strength and heat dissipation are better than plastic packaging, and the cost is advantageous. However, since the metal is directly plated on the ceramic substrate by means of electroplating, the air escape holes in conventional package structures with metal sidewalls are disposed on the top of the package structures, so that there are concerns about reliability.

BRIEF SUMMARY

The present disclosure provides a package structure. The package structure includes a substrate, a frame structure, and a lens portion. The frame structure is disposed on the substrate. A sidewall of the frame structure has multiple lamination traces thereon. The lens portion covers the substrate. The frame structure has a through hole passing through the sidewall, and the through hole includes an edge, and at least a portion of the lamination traces overlaps the edge of the through hole.

BRIEF DESCRIPTION OF THE DRAWINGS

Aspects of the disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion

DETAILED DESCRIPTION

Figure 1A:
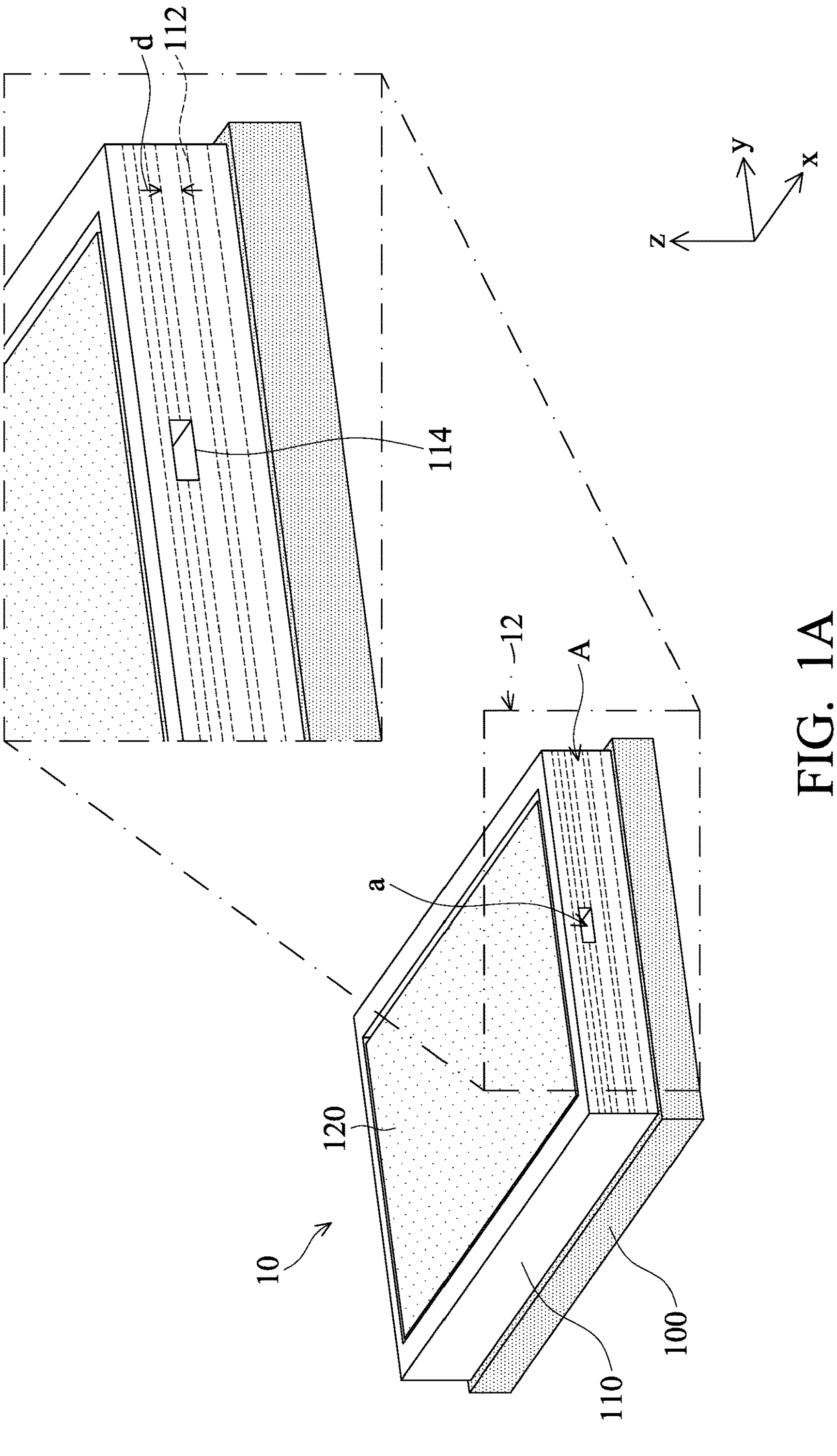
FIG. 1A illustrates a schematic view of a package structure and an enlarged view of a part thereof in accordance with some embodiments of the disclosure.

The following disclosure provides many different embodiments, or examples, for implementing different features of the provided subject matter. Specific examples of components and arrangements are described below to simplify the disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the disclosure may repeat reference numerals and/or letters in the various examples. This repetition is for the purpose of simplicity and clarity and does not in itself dictate a relationship between the various embodiments and/or configurations discussed.

Further, spatially relative terms, such as “beneath,” “below,” “lower,” “above,” “upper” and the like, may be used herein for ease of description to describe one element or feature’s relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The terms “about”, “approximately”, and “substantially” used herein generally refer to a given value or a range within 20 percent, preferably within 10 percent, and more preferably within 5 percent, within 3 percent, within 2 percent, within 1 percent, or within 0.5 percent. It should be noted that the amounts provided in the specification are approximate amounts, which means that even “about”, “approximate”, or “substantially” are not specified, the meanings of “about”, “approximate”, or “substantially” are still implied.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

The disclosure provides a package structure, which includes a frame structure with a plurality of lamination traces parallel to the upper surface of the substrate on the sidewall of the frame structure. The frame structure has an air hole penetrating the sidewall, wherein a portion of the lamination traces overlaps an edge of the air hole. By placing a removable sacrificial material during a deposition process that forms the frame structure, the air hole penetrating the sidewall of the frame structure can be formed in the middle of the sidewall. As a result, the package structure in the embodiment of the disclosure solves the problem that conventional package structures with metal sidewalls cannot provide air escape holes in the middle of the sidewalls, and the package structure in the embodiment of the disclosure can reduce the impact of the moisture on the microstructure of internal elements and have better reliability. In addition, compared with the frame structure made of plastic, the frame structure formed by electroplating has better strength and heat dissipation, and better bondability with the substrate.

FIG. 1A illustrates a schematic diagram of a package structure 10 and an enlarged view of a portion thereof according to some embodiments of the disclosure. The package structure 10 includes a substrate 100, a frame structure 110 disposed on the substrate 100, and a lens portion 120 covering the substrate 100. Next, referring to the enlarged view of the portion of the package structure 10 in the dashed block 12, the sidewall of the frame structure 110 has a plurality of lamination traces 112 parallel to the upper surface of the substrate 100, as shown by the dashed line in FIG. 1A. In addition, the frame structure 110 has an air hole 114 penetrating the sidewall, and a portion of the lamination traces 112 overlaps the edge of the air hole 114.

In some embodiments, the lamination traces 112 are resulted from an electroplating process for forming the frame structure 110, as described in further detail below.

The substrate 100 may be formed of any suitable insulating material. The material of the substrate 100 may include resin, sapphire, ceramic, other suitable materials, or a combination thereof. When the package structure 10 is for a laser device with higher power, the substrate 100 can be formed of a ceramic material to have better thermal conductivity and hardness.

In some embodiments, a thin metal layer may be formed on the upper surface of the substrate 100 by a process, such as evaporation or sputtering, as a seed layer for a subsequent electroplating process, and then the electroplating process forms the frame structure 110 having the air hole 114.

The disclosure does not specifically limit the material of the frame structure 110. In some embodiments, the frame structure 110 may include a material suitable for the electroplating process. For example, the frame structure 110 may be a metal frame including metal, such as copper. In some embodiments, since the frame structure 110 is deposited directly on the conductive material formed on the substrate 100 by an electroplating process, the bottom surface of the frame structure 110 can be in direct contact with the substrate 100. Compared with the frame structure 110 made of plastic, no other adhesive material is needed to be formed between the substrate 100 and the frame structure 110 deposited by the electroplating process. This can prevent microstructures in the package structure 10, such as light extraction holes on the chip or a microlens array on the lens, from being contaminated by the adhesive material, or prevent cracking and peeling between the frame structure 110 and the substrate 100 due to the deterioration of the adhesive material.

During the deposition process of the frame structure 110, a plurality of lamination traces 112 is formed on the sidewall of the frame structure 110 due to the rate variation of the deposition process (e.g., electroplating) and the positions where the different deposition stages begin and end. In some embodiments, as shown in FIG. 1A, the plurality of lamination traces 112 is parallel to each other, and adjacent lamination traces may have a variable distance d between each other. The spacing between the lamination traces 112 also depends on the rate variation during the deposition process (e.g., electroplating) of the frame structure 110 and the positions where the different deposition stages begin and end.

Figure 1B:
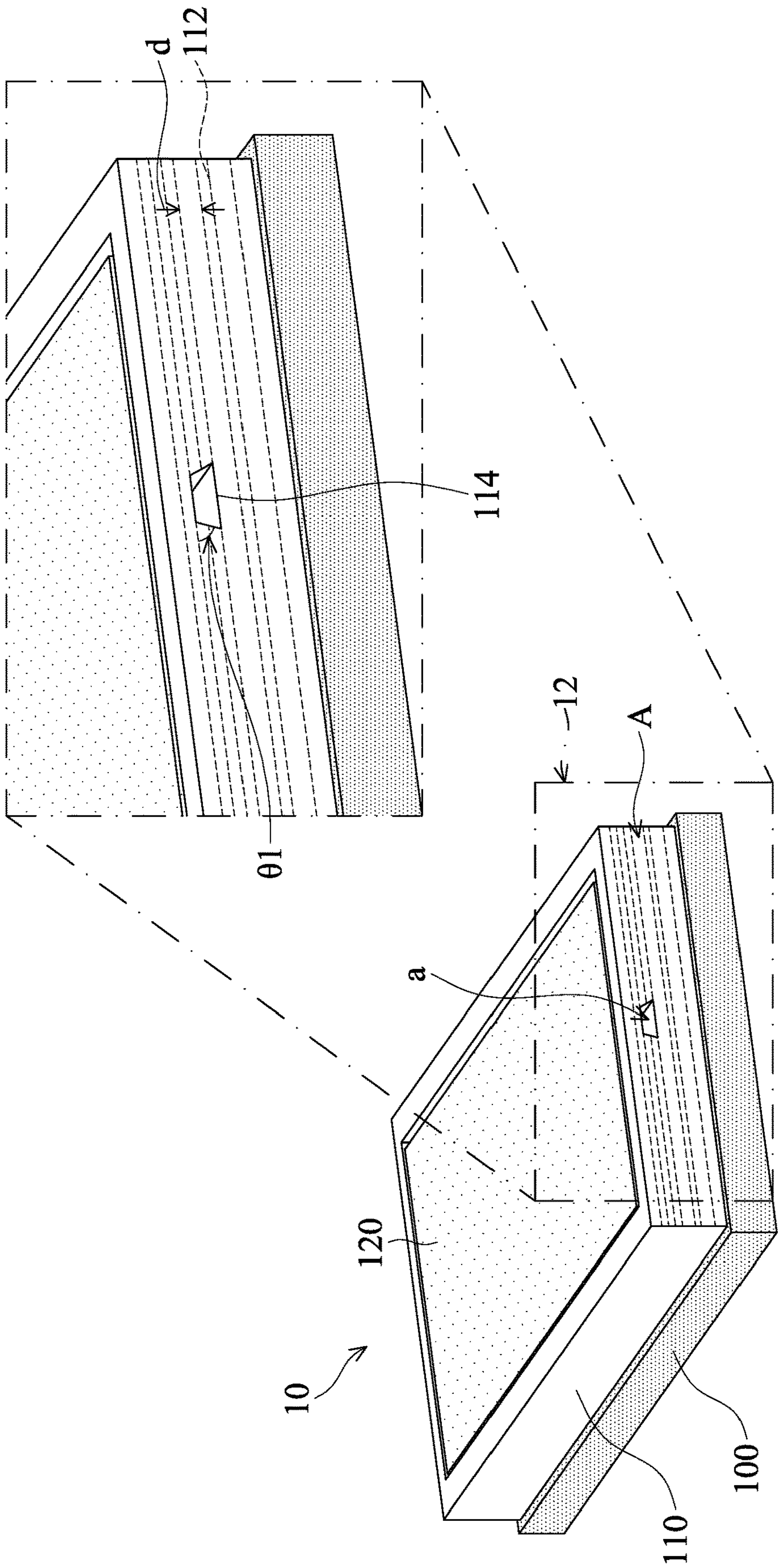
FIGS. 1B-1D illustrate schematic views of a package structure and enlarged views of a part thereof in accordance with other embodiments of the disclosure.
Figure 1C:
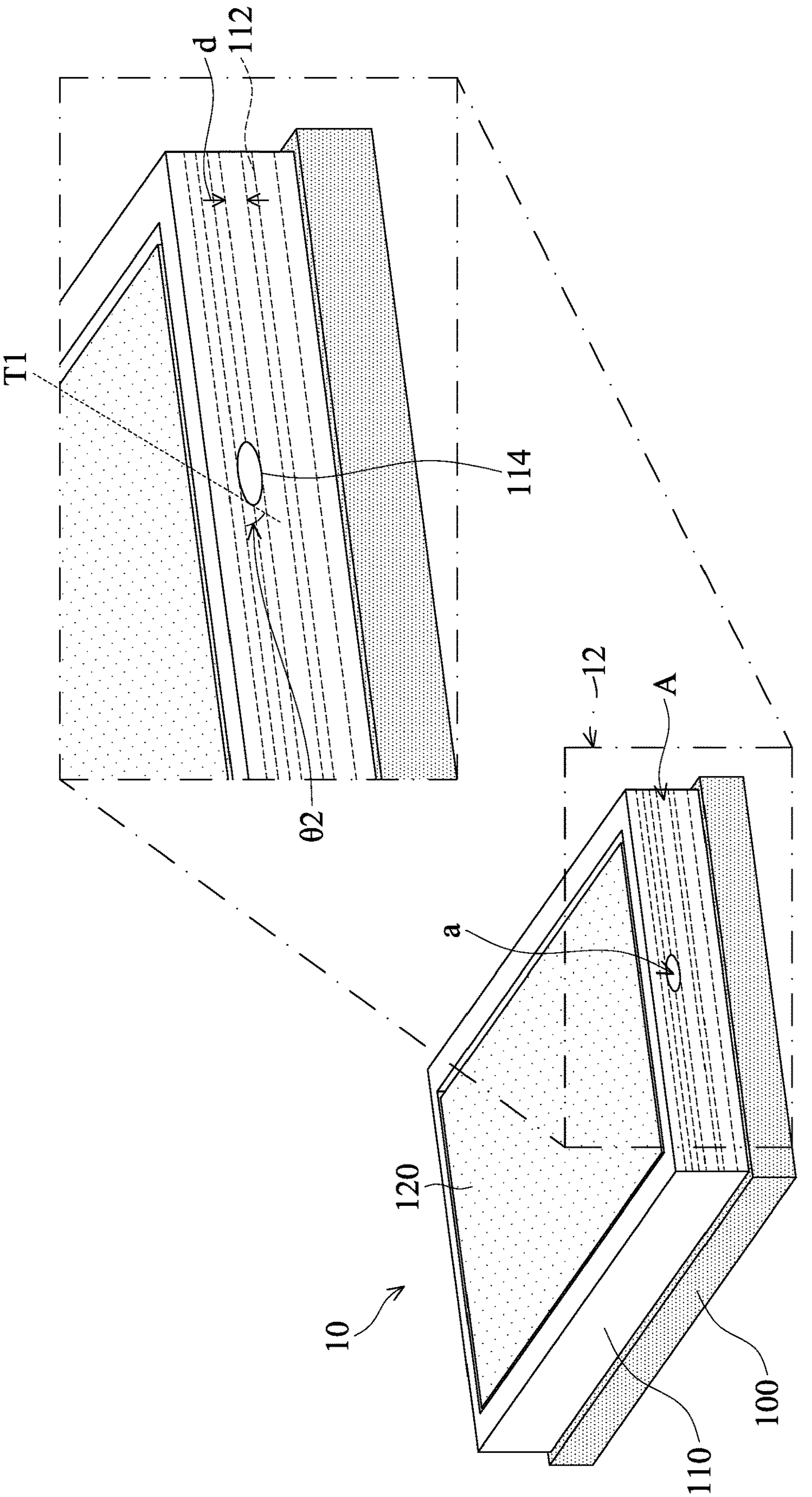
Figure 1D:
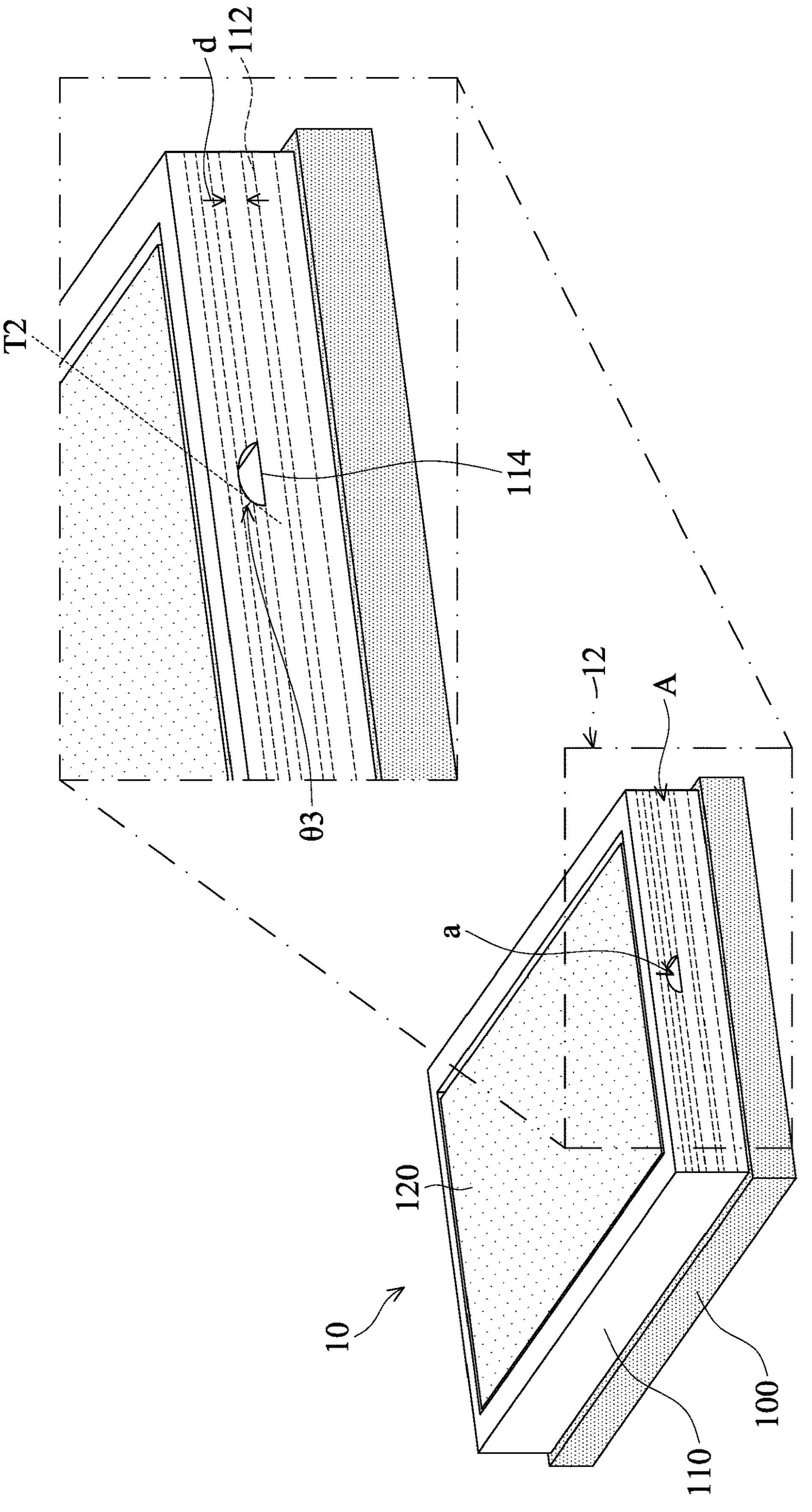

Although the air hole 114 shown in FIG. 1A has a shape of a rectangle, the disclosure does not limit the shape of the air hole 114, as long as the air hole 114 penetrates the sidewall of the frame structure 110. Referring to FIGS. 1B-1D of the drawings, the shape of the air hole 114 may include various polygons, a shape with arc-shaped edges (such as circle or elliptical shape), a mixed shape with both arc-shaped and linear edges (such as semicircular shape or sector), or an elongated slit shape further changed from the shapes aforementioned. For example, as shown in FIG. 1B, the shape of the air hole 114 may be a quadrilateral such as a rectangle or a trapezoid, and the bottom side overlaps a portion of the lamination traces 112 formed on the sidewall of the frame structure 110 during the electroplating process. In embodiments where the shape of the air hole 114 is triangular, the air hole 114 has a bottom side that is parallel to the lamination traces 112 and overlaps a portion of the lamination traces 112. In the embodiment in which the shape of the air hole 114 has an arc-shaped edge, as shown in FIG. 1C, the bottom of the air hole 114 is tangent to a portion of the lamination traces 112, and the tangent point of the bottom of the air hole 114 overlaps a portion of the lamination traces 112. In the embodiment in which the air hole 114 has a mixed shape of arc and line at the edges, as shown in FIG. 1D, the bottom side or bottom of the air hole 114 overlaps a portion of the lamination traces 112 as described above. In the embodiment in which the air hole 114 is modified into a slit shape, the long side of the slit may be parallel to the bottom surface of the substrate 100, perpendicular to the bottom surface of the substrate 100, or even neither parallel nor perpendicular to the bottom surface of the substrate 100 (i.e., oblique configuration). By forming the air hole 114 into a slit shape, compared with other shapes (e.g., circle, triangle, rectangle, trapezoid, semicircle, sector, etc.), foreign matters can be prevented from falling into the package structure 10. In addition, as shown in FIG. 1A, the air hole 114 may be sandwiched between two of the lamination traces 112 of the plurality of lamination traces 112.

In some embodiments, as shown in FIG. 1A, some of the lamination traces 112 intersect perpendicularly with the sides of the quadrilateral air hole 114. In embodiments where the air hole 114 has other polygonal shapes, the lamination traces 112 may also intersect the edge of the air hole 114 at an angle other than zero degree, such as an angle θ1 in FIG. 1B. In the embodiment in which the air hole 114 has a shape including an arc, as shown in FIGS. 1C and 1D, the lamination traces 112 may intersect with the edge of the air hole 114, wherein the angle between the portion of the lamination traces 112 and the direction of the tangent line (tangent lines T1 or T2) has a degree other than zero degree, such as the angles θ2 or θ3 in FIGS. 1C and 1D.

The disclosure does not limit the area of the air hole 114. In some embodiments, as shown in FIGS. 1A to 1D, the ratio of the area a of the air hole 114 to the area A of the sidewall where the air hole 114 is located falls within a range of $0<a/A<0.5$. For example, the ratio range may be $0<a/A<0.3$, $0<a/A<0.1$, $0<a/A<0.05$, $0<a/A<0.03$ or $0<a/A<0.01$. In some embodiments, the ratio of the area a of the air hole 114 to the area A of the sidewall through which the air hole 114 penetrates is about $a/A=0.01$.

It should be noted that although only one air hole 114 is shown on the sidewall of the frame structure 110 in FIG. 1A, the disclosure does not limit the number and arrangement of the air hole 114. In fact, the frame structure 110 may also have a plurality of air holes 114. In some embodiments, the air holes 114 on the frame structure 110 have a specific arrangement, which further improves the efficiency of gas flow.

Referring to FIG. 1A, a lens portion 120 located above the substrate 100 is disposed between the upper portion of the frame structure 110. The material of the lens portion 120 may include any transparent material, such as glass, resin, silicone, acrylic or other suitable transparent materials, or a combination thereof.

The lens portion 120 may include an optical structure. For example, the optical structure may be a diffuser including microstructures, but the embodiment is not limited thereto. In some other embodiments, the lens portion 120 may be replaced by a light-condensing structure, such as a semi-convex lens, a convex lens, a conical structure (e.g., cone, quadrangular pyramid, flat-topped cone, flat-topped quadrangular pyramid). Alternatively, the light-condensing structure may be a gradient-index structure or a diffractive optical sheet.

Referring to FIG. 1A, even though there is a gap shown between the frame structure 110 and the lens portion 120 for the sake of simplicity, there is actually an adhesive portion for the lens portion 120 between the frame structure 110 and the lens portion 120.

Figure 1E:
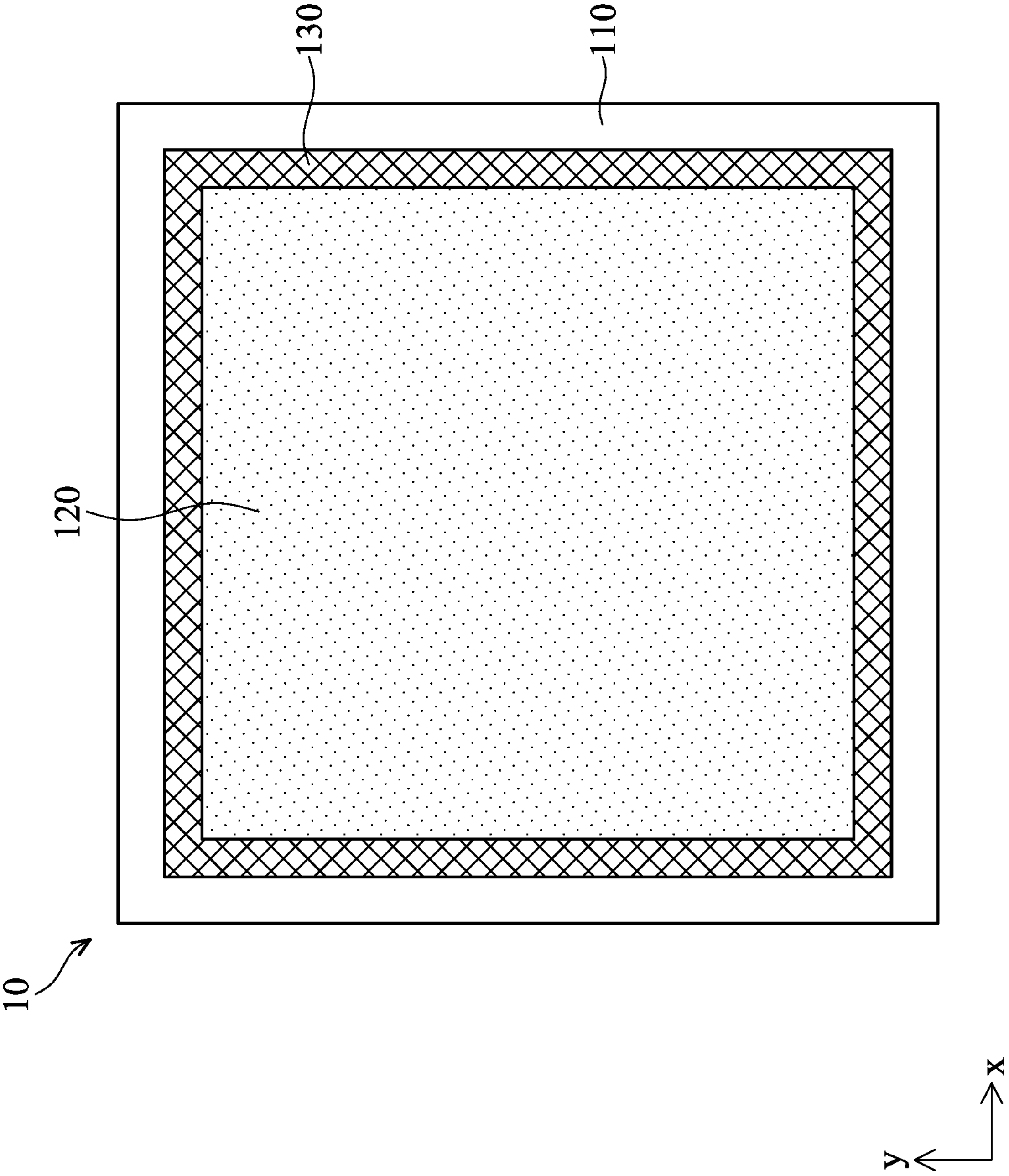
FIG. 1E illustrates a top view of a package structure in accordance with some embodiments of the disclosure.

Referring to the top view of the package structure 10 in FIG. 1E, the package structure 10 further includes an adhesive portion 130, and the adhesive portion 130 continuously fills the gap between the lens portion 120 and the frame structure 110 to form a closed ring.

In some embodiments, as shown in FIG. 1E, the adhesive portion 130 is sufficiently filled between the lens portion 120 and the frame structure 110, so that it is sealed between the lens portion 120 and the frame structure 110 without air holes. As a result, compared with the conventional technology where air escape holes are formed on the top of the package structure, the package structure 10 of the disclosure can reduce the impact of moisture on the internal microstructures and has better reliability.

Figure 1F:
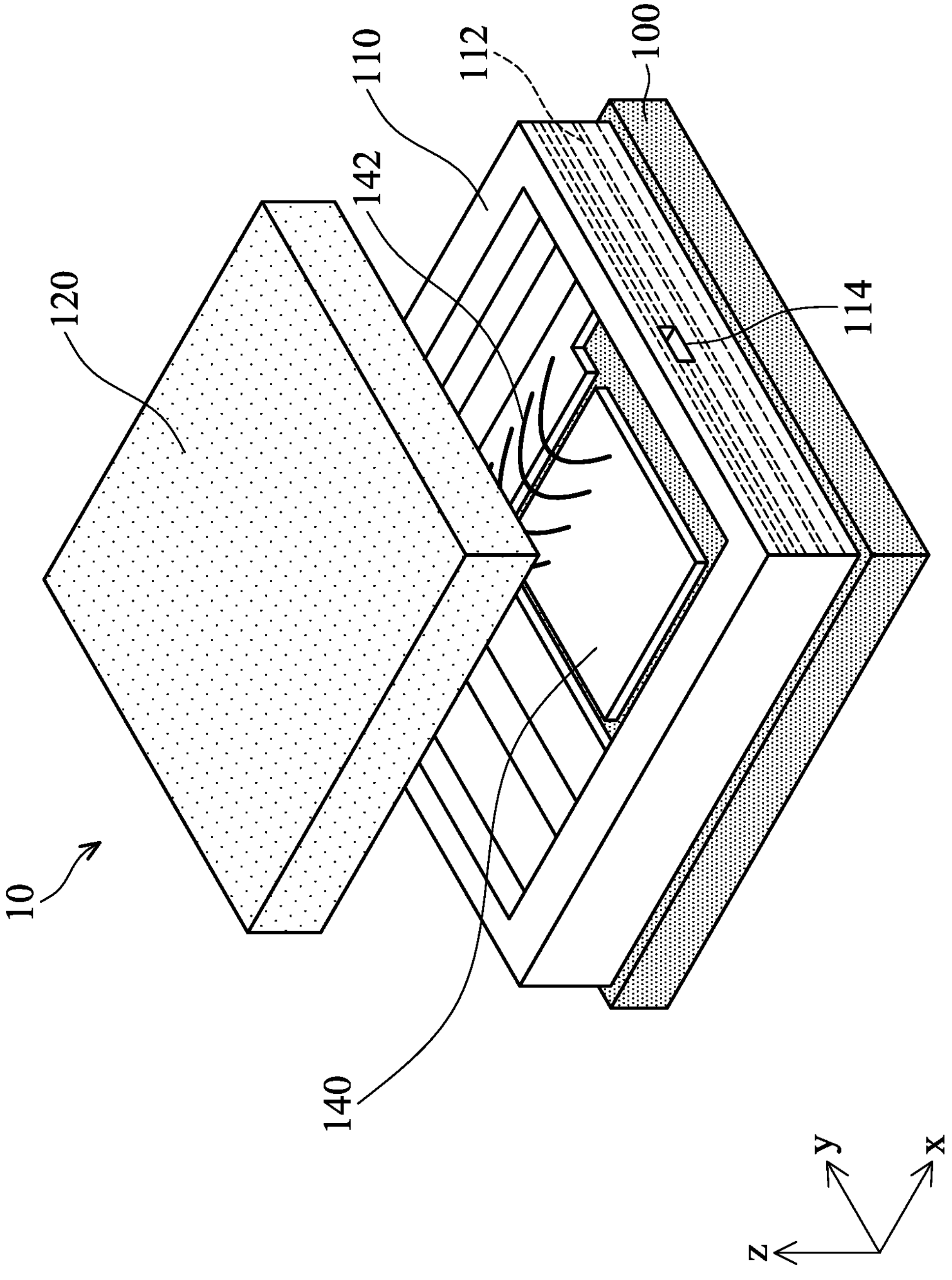
FIG. 1F illustrates an exploded view of a package structure in accordance with some embodiments of the disclosure.

According to some embodiments of the disclosure, FIG. 1F is an exploded view of the package structure 10. As shown in FIG. 1F, the inner side of the frame structure 110 may have a stepped profile, and such a structure may carry the lens portion 120 and the adhesive portion 130. In addition, the package structure 10 further includes a light emitting element 140 disposed between the substrate 100 and the lens portion 120, and the frame structure 110 surrounds the light-emitting element 140. In some embodiments, the light-emitting element 140 is a VCSEL element, but the disclosure is not limited thereto. The light-emitting element 140 may also be other suitable light-emitting devices. As shown in FIG. 1F, the light-emitting element 140 may be electrically connected to the substrate 100 by connecting members 142 such as gold wires or alloy wires. The light-emitting element 140 may also be directly soldered on the substrate 100 as a flip chip manner, but the disclosure is not limited thereto.

FIGS. 2A-2E illustrate the method of forming the package structure having the air hole 114 on the frame structure 110 as described above, wherein FIGS. 2A to 2E can be regarded as side views corresponding to the y and z directions of FIG. 1A. It should be noted that elements that are the same or similar to the elements in FIGS. 1A-1C will be denoted by the same reference numerals in FIGS. 2A-2E.

Figure 2A:
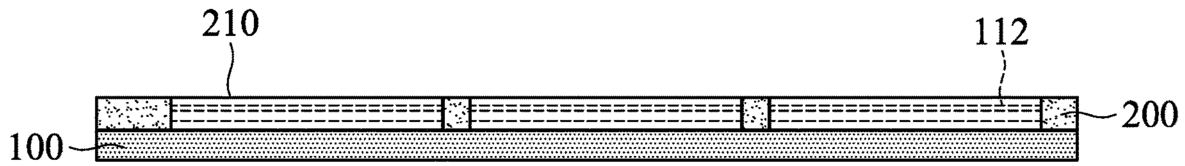
FIGS. 2A-2E illustrate side views of a package structure in various stages of a manufacturing process in accordance with some embodiments of the disclosure.

Referring to FIG. 2A, the substrate 100 is first provided, and a patterned separator 200 is formed on the substrate 100. The separator 200 is a frame structure for separating respective package structures formed subsequently, and may be removed after forming the respective package structures. The disclosure does not limit the pattern shape of the separator 200. In one embodiment, the separator 200 may be grid-like, and the various elements of the package structures may be formed between the grids.

The material of the separator 200 may include photoresist, such as positive photoresist or negative photoresist. In some embodiments, the separator 200 may include a hard mask and may be formed of silicon oxide, silicon nitride, silicon oxynitride, silicon carbide, silicon carbonitride, similar materials, or a combination thereof. The separator 200 may be a single-layer or multi-layer structure. The method of forming the separator 200 may include a deposition process, a lithography process, or the like. The deposition process as above may include a spin coating process. The above etching process may include a dry etching process, a wet etching process, a reactive ion etching (RIE) process, or a combination thereof.

Next, a partial frame structure 210 may be formed in the space surrounded by the separator 200, and the partial frame structure 210 has a plurality of lamination traces 112 thereon parallel to the substrate 100. As shown in FIG. 2A, air holes have not been formed on the partial frame structure 210. In some embodiments, the lamination traces 112 are resulted from an electroplating process for forming the partial frame structure 210. In addition, the spacing between the lamination traces 112 depends on the rate variation during the deposition process (e.g., electroplating) of the partial frame structure 210 and the location of the start and end of the different deposition stages.

Figure 2B:
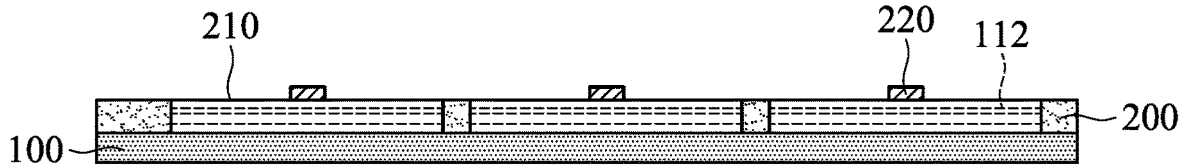

Referring to FIG. 2B, a conductive sacrificial layer 220 may then be formed on the frame structure 210. In a side view parallel to sidewalls of the partial frame structure 210, the conductive sacrificial layer 220 may have a shape corresponding to a subsequently formed air hole (e.g., the air holes 114). The conductive sacrificial layer 220 may include a conductive material, such as a conductive photoresist. By forming the conductive sacrificial layer 220 with a conductive material, a subsequent electroplating metal layer may be formed on the conductive sacrificial layers 220. In some embodiments, the formation of the conductive sacrificial layer 220 may include a deposition process or a lithography process. The deposition process described above may include, for example, electroplating. In some embodiments, through various patterning processes, the conductive sacrificial layer 220 may be formed to have various shapes in the side view parallel to the sidewalls of the partial frame structure 210, such as a quadrilateral shape or a slit shape.

Figure 2C:
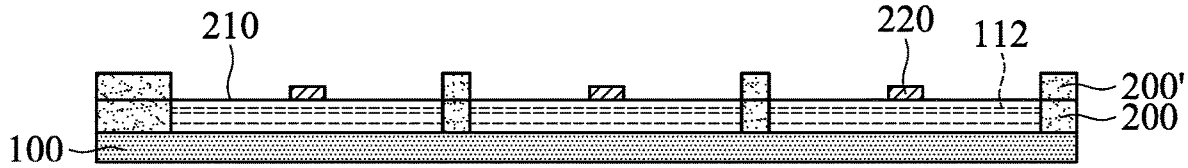

Referring to FIG. 2C, another partition 200' is deposited on the separator 200, and the separator 200' is used to separate a partial frame structure formed in another deposition stage. In addition, although the separator 200' is formed to have a higher top surface than the conductive sacrificial layer 220 in FIG. 2C, the disclosure is not limited thereto. In some embodiments, the separator 200' has a top surface lower than or equal to the conductive sacrificial layer 220, and the steps described in FIG. 2B may be repeated to form another layer of conductive sacrificial layer connected to the conductive sacrificial layer 220. As a result, air holes of various shapes can be formed by a subsequent removal process of the conductive sacrificial layer.

Figure 2D:
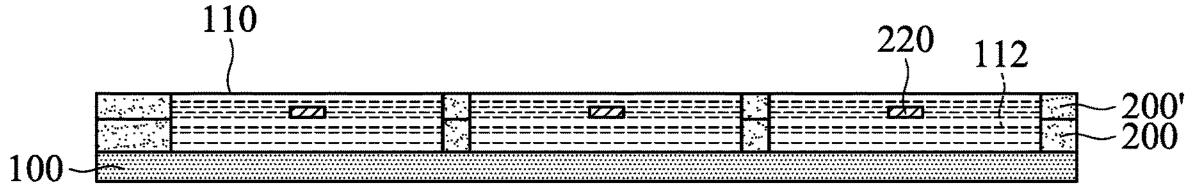

Referring to FIG. 2D, another layer of partial frame structure is deposited on the partial frame structure 210 and the conductive sacrificial layer to form the frame structure 110, wherein the conductive sacrificial layer 220 penetrates the sidewall of the frame structure 110. The above-mentioned another layer of partial frame structure and the part of the frame structure 210 together constitute the frame structure 110.

It should be noted that since each layer of the parts of the frame structures are formed in different deposition steps, one of the lamination traces 112 can overlap at the junction between each layer of the parts of the frame structures, and also overlap the bottom edge or bottom of the conductive sacrificial layer 220. Furthermore, in some embodiments, one of the lamination traces 112 can substantially correspond to the junction of the separators 200 and 200'. It should be understood that, since the material and forming method of the above-mentioned another layer of the part of the frame structure may be similar to the partial frame structure 210, the detailed description thereof is omitted here for the sake of brevity.

Figure 2E:
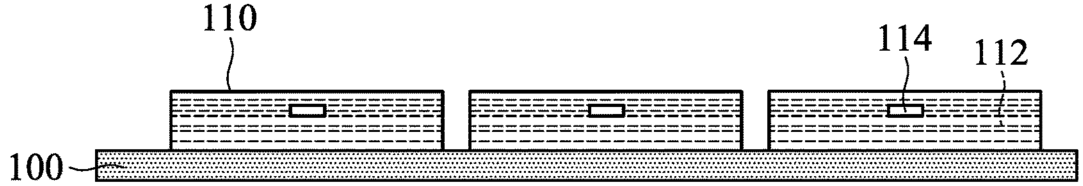

Referring to FIG. 2E, after the deposition of the frame structure 110 is completed, the conductive sacrificial layer 220 in the frame structure 110 may be removed and the air holes 114 may be formed by an etching or cleaning process. In addition, the separators 200 and 200' may also be removed through an etching or cleaning process, thereby exposing the sidewalls of the frame structure 110.

Through the manufacturing process shown in FIGS. 2A-2E, the package structure having the air hole 114 in the middle of the sidewall of the frame structures 110 may be formed. Compared with the conventional technology in which the air holes are formed on the top of the package structure, the package structure of the disclosure can reduce the impact of moisture on the internal microstructures and has better reliability.

Although only one air hole 114 is formed on the sidewall of the frame structure 110 in the manufacturing process of FIGS. 2A-2E, the disclosure is not limited thereto. In fact, by arbitrarily repeating or combining the steps in FIGS. 2A-2D, various numbers and arrangements of air holes 114 may be formed on the sidewall of the frame structure 110. In particular, more than two layers of separators may also be formed during the fabrication process and multiple stages of deposition of the frame structure 110 may be performed to form air holes 114 that are positioned differently in the vertical direction.

In addition, it should be noted that in the embodiment with multiple air holes 114, the bottom edge or bottom of each air hole 114 can overlap the lamination traces 112. The reason is each of the conductive sacrificial layers are formed between different deposition stages of the frame structure

110. However, it should be understood that even in a part of the frame structure 110 deposited in the same deposition stage, there may be lamination traces 112 with variable spacing on the sidewalls of the part of the frame structure.

It should be understood that the light-emitting element (not shown) of the package structure may be formed before, during, or after the package structure is formed, which is not limited in the disclosure. In addition, after the air hole 114 is formed, a lens portion (not shown) may be formed above the substrate 100 and between the upper portion of the frame structure 110.

The disclosure provides a package structure, the sidewall of the frame structure has a plurality of lamination traces parallel to the substrate, and the frame structure has an air hole penetrating the sidewall, wherein a portion of the lamination traces overlaps the edges of the air hole. By placing a subsequently removable sacrificial material during deposition of the frame structure, air holes penetrating through the sidewall of the frame structure may be formed in the middle of the sidewalls. As a result, compared with the conventional technology of forming the air escape hole on the top of the package structure, the package structure of the disclosure can reduce the influence of moisture on the internal microstructures and has better reliability. In addition, compared with the frame structure made of plastic, the frame structure formed by electroplating has better strength and heat dissipation, and better bondability with the substrate.

The foregoing outlines features of several embodiments so that those skilled in the art may better understand the aspects of the disclosure. Those skilled in the art should appreciate that they may readily use the disclosure as a basis for designing or modifying other processes and structures for carrying out the same purposes and/or achieving the same advantages of the embodiments introduced herein. Those skilled in the art should also realize that such equivalent constructions do not depart from the spirit and scope of the disclosure, and that they may make various changes, substitutions, and alterations herein without departing from the spirit and scope of the disclosure.

What is claimed is:

1. A package structure, comprising:
- a substrate;
- a frame structure, disposed on the substrate, and comprising a sidewall with a plurality of lamination traces, and a through hole having an edge and passing through the frame structure to expose on the sidewall; and
- a lens portion covering the substrate,
- wherein the edge resides on one of the plurality lamination traces.

2. The package structure as claimed in claim 1, wherein the frame structure is a metal frame.

3. The package structure as claimed in claim 1, wherein the through hole is a quadrilateral, and the portion of the lamination traces overlaps a bottom side of the quadrilateral.

4. The package structure as claimed in claim 3, wherein a portion of the lamination traces intersects a side of the quadrilateral perpendicularly.

5. The package structure as claimed in claim 1, wherein a ratio of an area a of the through hole to an area A of the sidewall through which the through hole passes is in the range of $0<a/A\leq 0.5$.

6. The package structure as claimed in claim 1, further comprising an adhesive portion, with the adhesive portion continuously filling a gap between the lens portion and the frame structure to form a closed ring.

7. The package structure as claimed in claim 1, wherein the through hole is sandwiched between two of the lamination traces.

8. The package structure as claimed in claim 1, wherein an inner side of the frame structure has a stepped profile.

9. The package structure as claimed in claim 1, wherein a bottom surface of the frame structure is in direct contact with the substrate.

10. The package structure as claimed in claim 1, further comprising:

a light-emitting element disposed between the substrate and the lens portion, with the frame structure surrounding the light-emitting element.

* * * * *